United States Patent
Duan et al.

(10) Patent No.: US 10,505,361 B2
(45) Date of Patent: Dec. 10, 2019

(54) INTEGRATED CIRCUIT WITH REVERSE CURRENT PROTECTION AND POWER SOURCE DISCONNECTION DETECTION

(71) Applicant: NXP B.V., Eindhoven (NL)

(72) Inventors: Xindong Duan, Shanghai (CN); Tinghua Yun, Shanghai (CN); Jian Qing, Shanghai (CN)

(73) Assignee: NXP B.V., Eindhoven (NL)

( * ) Notice: Subject to any disclaimer, the term of this patent is extended or adjusted under 35 U.S.C. 154(b) by 290 days.

(21) Appl. No.: 15/679,005

(22) Filed: Aug. 16, 2017

(65) Prior Publication Data

US 2018/0138691 A1  May 17, 2018

(30) Foreign Application Priority Data

Nov. 14, 2016 (CN) ......................... 2016 1 1019662

(51) Int. Cl.
| | |
|---|---|
| *H02H 3/00* | (2006.01) |
| *H02H 3/18* | (2006.01) |
| *G01R 19/00* | (2006.01) |
| *H02H 7/12* | (2006.01) |
| *H02M 3/335* | (2006.01) |
| *H02J 7/00* | (2006.01) |

(52) U.S. Cl.
CPC ........... *H02H 3/18* (2013.01); *G01R 19/0092* (2013.01); *H02H 7/1213* (2013.01); *H02J 7/0031* (2013.01); *H02M 3/33507* (2013.01); *H02M 3/33592* (2013.01)

(58) Field of Classification Search
None
See application file for complete search history.

(56) References Cited

U.S. PATENT DOCUMENTS

| | | |
|---|---|---|
| 5,946,207 A | 8/1999 | Schoofs |
| 7,183,756 B1 | 2/2007 | Dikken et al. |
| 7,394,633 B2 | 7/2008 | Sasitornwannakul et al. |
| 8,508,078 B2 * | 8/2013 | Posat ................ H03K 17/0822 307/127 |
| 9,077,190 B2 * | 7/2015 | Posat ................ H03K 17/0822 |

* cited by examiner

*Primary Examiner* — Stephen W Jackson

(57) ABSTRACT

An integrated circuit (IC) includes a switch transistor, a gate driver circuit, a current sensor circuit, a voltage drop regulation circuit, and a charge-release circuit. The switch transistor is connected between input and output ports of the IC, and receives an input signal from a power source and provides the input signal as an output signal to the output port. The current sensor circuit detects the current through the switch transistor. The gate driver circuit drives the switch transistor using a control signal. The voltage drop regulation circuit is activated when the current flowing through the switch transistor is low. The voltage drop regulation circuit controls the control signal to increase the voltage across the switch transistor. When the power source is disconnected, the charge-release circuit transfers residual charge from the input port of the IC to ground.

20 Claims, 4 Drawing Sheets

INTEGRATED CIRCUIT WITH REVERSE CURRENT PROTECTION AND POWER SOURCE DISCONNECTION DETECTION

BACKGROUND

The present invention relates generally to integrated circuits, and, more particularly, to a load switch for an integrated circuit.

Load switches are used in electronic circuits to either connect or disconnect a power source to or from a load. Load switches are commonly used in battery charging circuits to charge batteries connected as the load. Typically, a load switch has an input port for receiving an input signal from the power source and an output port connected to the battery. The load switch provides the input signal as an output signal to the battery by way of the output port in order to charge the battery. The load switch includes a transistor connected between the input and output ports. When the power source is disconnected and the load switch is active, it has a very low resistance, which is in the order of tens of milliohms. This resistance is referred to as "ON resistance". Due to the low ON resistance, a reverse current is supplied to the load switch by the battery, which discharges the battery. Further, the reverse current results in thermal power dissipation across the transistor, which increases linearly with an increase in the reverse current, such that the thermal power dissipation may exceed a thermal rating of the transistor, which could damage the load switch. Further, reconnecting the power source when the load switch is active can cause a current surge that may damage the battery.

A known technique to overcome the aforementioned problem is to compare voltages at the input and output ports of the load switch and to include a current sensing circuit in the load switch. The current sensing circuit includes transistors, operation amplifiers, and the like. When the power source is disconnected and the load switch is active, a voltage at the output port is greater than a voltage at the input port due to a voltage drop caused by the ON resistance. Since the value of the ON resistance is very low, a voltage difference between the voltages at the input and output ports is low. Hence, it is difficult to determine the disconnect status of the power source from the load. Further, due to the low voltage difference between the voltages at the input and output ports, the transistors of the current sensing circuit have poor matching with each other, which decreases the accuracy of the current sensing circuit. Hence, detection of the reverse current by the current sensing circuit is inaccurate and difficult. Further, when a level of the current of the input signal is less than a threshold value, the current sensing circuit does not accurately detect the level of the current of the input signal.

It would be advantageous to have a load switch that detects disconnection of the power source, provides a reverse current protection, and has improved current sense accuracy.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
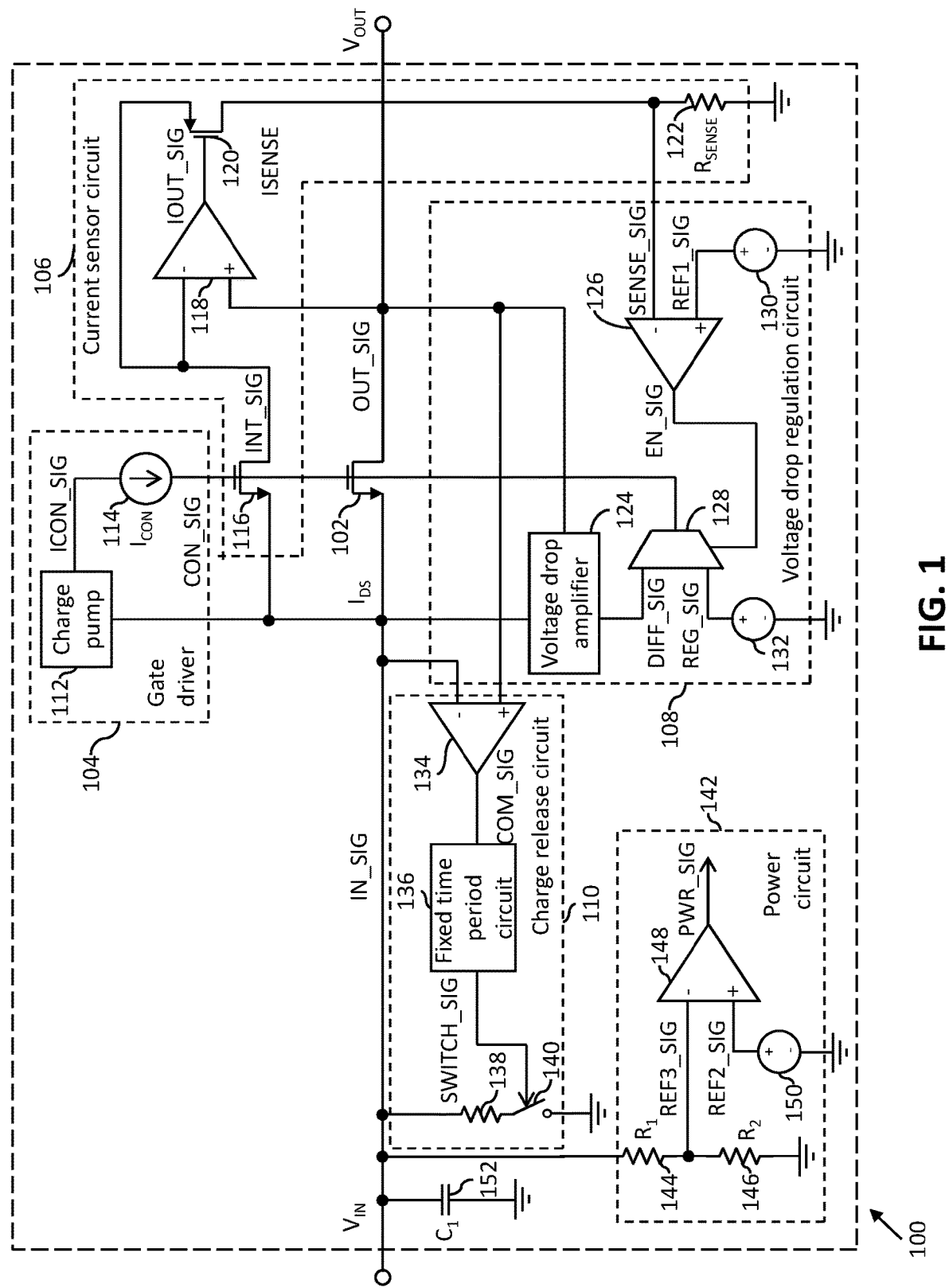
FIG. 1 is a schematic block diagram of an integrated circuit (IC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment of the present invention, an integrated circuit (IC) is provided. The IC includes a switch transistor, a gate driver circuit, a current sensor circuit, a voltage drop regulation circuit, and a charge-release circuit. The switch transistor 102 has a source terminal to receive an input signal and a drain terminal to output an output signal. The gate driver circuit is connected to the source terminal of the switch transistor. The gate driver circuit is further connected to a gate terminal of the switch transistor to receive the input signal. The gate driver circuit generates a control signal that drives the gate terminal of the switch transistor. The current sensor circuit is connected to the source and drain terminals of the switch transistor and the gate driver circuit. The current sensor circuit receives the input and output signals and the control signal and generates a sense signal. The sense signal indicates a current level of the input signal. The voltage drop regulation circuit receives a regulated signal and a first reference signal, respectively. The voltage drop regulation circuit is further connected to the source and drain terminals of the switch transistor, the gate driver circuit, and the current sensor circuit to receive the input, output, control signal, and sense signals, respectively. The voltage drop regulation circuit sinks a current of the control signal when a voltage level of the sense signal is less than a voltage level of the first reference signal. The charge-release circuit is connected to the source and drain terminals of the switch transistor to receive the input and output signals, respectively. The charge-release circuit connects the source terminal of the switch transistor to ground for a predetermined time period when a voltage level of the input signal is less than a voltage level of the output signal.

In another embodiment of the present invention, an integrated circuit (IC) is provided. The IC includes a switch transistor, a gate driver circuit, a current sensor circuit, a voltage drop regulation circuit, and a charge-release circuit. The switch transistor has a source terminal to receive an input signal and a drain terminal to output an output signal. The gate driver circuit is connected to the source terminal of the switch transistor. The gate driver circuit is further connected to a gate terminal of the switch transistor to receive the input signal and generate a control signal. The current sensor circuit includes a sense transistor, an amplifier, an intermediate transistor, and a sense resistor. The sense transistor has a source terminal connected to the source terminal of the switch transistor to receive the input signal, a gate terminal connected to the gate driver circuit and a gate terminal of the switch transistor to receive the control signal, and a drain terminal that outputs an intermediate signal. The gate driver circuit drives the gate terminals of the switch and sense transistors using the control signal. The amplifier has a first terminal connected to the drain terminal of the sense transistor to receive the intermediate signal, a second terminal connected to the drain terminal of the switch transistor to receive the output signal, and an output terminal to output an intermediate output signal based on a comparison of a voltage level of the intermediate signal with a voltage level of the output signal. The intermediate transistor has a source terminal connected to the drain terminal of the sense transistor to receive the intermediate signal, a gate terminal connected to the output terminal of the amplifier to receive the intermediate output signal, and a drain terminal to output an intermediate sense signal. The sense resistor is connected between the drain terminal of the intermediate transistor and ground to receive the intermediate sense signal and generates a sense signal. The sense signal indicates a current level of the input signal. The voltage drop regulation circuit includes a first comparator, a voltage drop amplifier, and a transconductance amplifier. The first comparator receives a first reference signal, and is connected to the sense resistor to receive the sense signal. The first comparator compares a voltage level of the first reference signal with a voltage level of the sense signal and generates an enable signal. The first comparator activates the enable signal when the voltage level of the first reference signal is greater than the voltage level of the sense signal and deactivates the enable signal when the voltage level of the first reference signal is less than the voltage level of the sense signal. The voltage drop amplifier is connected to the source and drain terminals of the switch transistor. The voltage drop amplifier compares the voltage levels of the input and output signals and generates a difference signal. The difference signal indicates of a voltage across the switch transistor. The transconductance amplifier has a first terminal connected to the voltage drop amplifier to receive the difference signal, a second terminal that receives a regulated signal, an enable terminal connected to the first comparator to receive the enable signal, and an output terminal that sinks a current of the control signal when the first comparator activates the enable signal. The charge-release circuit includes a fast path comparator, a fixed time period circuit, a by-pass transistor, and a switch. The fast path comparator is connected to the source and drain terminals of the switch transistor to receive the input and output signals, respectively. The fast path comparator generates a compare signal based on a comparison of the voltage across the switch transistor. The fast path comparator activates the compare signal when the voltage level of the output signal is greater than a voltage level of the input signal and deactivates the compare signal when the voltage level of the output signal is less than the voltage level of the input signal. The fixed time period circuit is connected to the fast path comparator to receive the compare signal and generate a switch signal. The by-pass resistor is connected to the source terminal of the switch transistor and a switch is connected between the by-pass resistor and ground. The switch is further connected to the fast path comparator to receive the switch signal. The fixed time period circuit activates the switch signal for a predetermined time period when the switch signal is activated, thereby activating the switch for the predetermined time period.

In yet another embodiment of the present invention, an integrated circuit (IC) is provided. The IC includes a switch transistor, a gate driver circuit, a voltage drop regulation circuit, and a charge-release circuit. The switch transistor has a source terminal to receive an input signal and a drain terminal to output an output signal. The gate driver circuit is connected to the source terminal of the switch transistor to receive the input signal. Further, the gate driver circuit is connected to a gate terminal of the switch transistor. The gate driver circuit generates a control signal that drives the gate terminal of the switch transistor. The voltage drop regulation circuit receives a regulated signal and an enable signal. Further, the voltage drop regulation circuit is connected to the source and drain terminals of the switch transistor, and the gate driver circuit to receive the input, output, and control signals, respectively, and sinks a current of the control signal, thereby controlling a voltage across the switch transistor. The charge-release circuit is connected to the source and drain terminals of the switch transistor to receive the input and output signals, respectively. The charge-release circuit connects the source terminal of the switch transistor to ground for a predetermined time period when a voltage level of the input signal is less than a voltage level of the output signal.

Various embodiments of the present invention provide an integrated circuit (IC) that includes a switch transistor, a gate driver circuit, a current sensor circuit, a voltage drop regulation circuit, and a charge-release circuit. The switch transistor has a source terminal to receive an input signal and a drain terminal to output an output signal. The gate driver circuit drives a gate terminal of the switch transistor using a control signal. The current sensor circuit is connected to the source and drain terminals of the switch transistor to detect a current level of the input signal. The current sensor circuit generates a sense signal that has a voltage level proportional to the current level of the input signal. The voltage drop regulation circuit includes a voltage drop amplifier, a first comparator, and a tranconductance amplifier. The voltage drop amplifier detects a voltage across the switch transistor. The first comparator compares the sense signal with a first reference signal and generates an enable signal. The transconductance amplifier receives a regulated signal and the enable signal, and sinks a current of the control signal when the enable signal is activated. The transconductance amplifier sinks the current of the control signal until the voltage across the switch transistor is equal to a voltage level of the regulated signal. Further, when the power source is disconnected, the transconductance amplifier sinks the current of the control signal such that the switch transistor is switched OFF. Moreover, when the power source is disconnected the charge-release circuit transfers the residual charges from the input port of the IC to ground.

In order to accurately detect the disconnection of the power source and measure the current level of the input signal, the voltage across the switch transistor is required to be greater than a threshold voltage. When the current level of the input signal is low, the transconductance amplifier is activated. The transconductance amplifier increases the voltage across the switch transistor until it is equal to the voltage level of the regulated signal, thereby improving detection of the power source and the current sense accuracy of the current sensor circuit. Further, when the power source is disconnected, the transconductance amplifier switches OFF the switch transistor, thereby providing reverse current protection.

Referring now to FIG. 1, a schematic block diagram of an integrated circuit (IC) 100 in accordance with an embodiment of the present invention is shown. The IC 100 is a load switch that is typically used in a battery charging circuit. The IC 100 has an input port that is connected to a power source (not shown) and an output port that is connected to a battery (not shown). The IC 100 includes a switch transistor 102, a gate driver circuit 104, a current sensor circuit 106, a voltage drop regulation circuit 108, and a charge-release circuit 110.

The switch transistor 102 has source and drain terminals that are input and output ports of the IC 100, respectively. The source terminal of the switch transistor 102 receives an input signal IN_SIG from the power source and outputs an output signal OUT_SIG at the drain terminal of the switch transistor 102. In the presently preferred embodiment, the switch transistor 102 is an n-channel metal-oxide semiconductor (NMOS) transistor.

The gate driver circuit 104 is connected to the source terminal of the switch transistor 102 to receive the input signal IN_SIG and generate a control signal CON_SIG. The gate driver circuit 104 drives the switch transistor 102 using the control signal CON_SIG. The gate driver circuit 104 includes a charge pump 112 and a current source 114. The charge pump 112 receives the input signal IN_SIG and generates an intermediate control signal ICON_SIG. The current source 114 receives the intermediate control signal ICON_SIG and generates the control signal CON_SIG.

The current sensor circuit 106 is connected to the source and drain terminals of the switch transistor 102 and the gate driver circuit 104. The current sensor circuit 106 receives the input and output signals IN_SIG and OUT_SIG and the control signal CON_SIG and generates a sense signal SENSE_SIG. The current sensor circuit 106 includes a sense transistor 116, an amplifier 118, an intermediate transistor 120, and a sense resistor 122.

The sense transistor 116 has a source terminal that receives the input signal IN_SIG and a gate terminal connected to the gate driver circuit 104 to receive the control signal CON_SIG. The gate driver circuit 104 drives the gate terminal of the sense transistor 116 using the control signal CON_SIG. The sense transistor 116 further has a drain terminal that outputs an intermediate signal INT_SIG. The intermediate signal INT_SIG has current and voltage levels proportional to current and voltage levels of the input signal IN_SIG, respectively. In the presently preferred embodiment, the sense transistor 116 is an n-channel metal-oxide semiconductor (NMOS) transistor.

The amplifier 118 has a first terminal connected to the drain terminal of the sense transistor 116 to receive the intermediate signal INT_SIG and a second terminal connected to the drain terminal of the switch transistor 102 to receive the output signal OUT_SIG, and an output terminal that outputs an intermediate output signal IOUT_SIG based on a comparison of a voltage level of the intermediate signal INT_SIG with a voltage level of the output signal OUT_SIG.

The intermediate transistor 120 has a gate terminal connected to the output terminal of the amplifier 118 to receive the intermediate output signal IOUT_SIG, a source terminal connected to the first terminal of the amplifier 118 to receive the intermediate signal INT_SIG, and a drain terminal that outputs an intermediate sense signal ISENSE. In the presently preferred embodiment, the intermediate transistor 120 is a p-channel metal-oxide semiconductor (PMOS) transistor. The sense resistor 122 is connected between the drain terminal of the intermediate transistor 120 and ground. The sense resistor 122 receives the intermediate sense signal ISENSE and generates the sense signal SENSE_SIG. A voltage of the sense signal SENSE_SIG is proportional to a current level of the input signal IN_SIG.

The voltage drop regulation circuit 108 sinks a current of the control signal. CON_SIG from the gate driver circuit 104 by way of the switch and sense transistors 102 and 116. The voltage drop regulation circuit 108 includes a voltage drop amplifier 124, a first comparator 126, a transconductance amplifier 128, a first reference supply 130, and a regulated supply 132.

The voltage drop amplifier 124 has a first terminal that is connected to the source terminal of the switch transistor 102, a second terminal connected to the drain terminal of the switch transistor 102, and an output terminal that generates a difference signal DIFF_SIG based on a comparison of the voltage levels of the input and output signals IN_SIG and OUT_SIG. The difference signal DIFF_SIG indicates a voltage across the switch transistor 102.

The first comparator 126 has a first terminal that is is connected to the sense resistor 122 to receive the sense signal SENSE_SIG, a second terminal connected to the first reference supply 130 to receive a first reference signal REF1_SIG, and an output terminal that generates an enable signal EN_SIG. The first comparator 126 compares a voltage level of the first reference signal REF1_SIG with a voltage level of the sense signal SENSE_SIG. The first comparator 126 activates the enable signal EN_SIG when the voltage level of the first reference signal REF1_SIG is greater than the voltage level of the sense signal SENSE_SIG and deactivates the enable signal EN_SIG when the voltage level of the first reference signal REF1_SIG is less than the voltage level of the sense signal SENSE_SIG.

The transconductance amplifier 128 has a first terminal connected to the voltage drop amplifier 124 to receive the difference signal DIFF_SIG, a second terminal connected to the regulated supply 132 to receive a regulated signal REG_SIG, an enable terminal connected to the first comparator 126 to receive the enable signal EN_SIG, and an output terminal that sinks the current of the control signal CON_SIG. The regulated signal REG_SIG has a voltage level that corresponds to the voltage across the switch transistor 102 for which the current sensor circuit 106 accurately detects the current level of the input signal IN_SIG. The transconductance amplifier 128 sinks the current of the control signal CON_SIG by a value that is proportional to the voltage across the switch transistor 102.

The charge-release circuit 110 connects the source terminal of the switch transistor 102 to ground when the power source is disconnected. The charge-release circuit 110 includes a fast path comparator 134, a fixed time period circuit 136, a by-pass resistor 138, and a switch 140.

The fast path comparator 134 that has first and second terminals connected to the source and drain terminals of the switch transistor 102 to receive the input and output signals IN_SIG and OUT_SIG, respectively, and an output terminal that generates a compare signal COM_SIG. The fast path comparator 134 activates the compare signal COM_SIG when the voltage level of the output signal OUT_SIG is greater than a voltage level of the input signal IN_SIG and deactivates the compare signal COM_SIG when the voltage level of the output signal OUT_SIG is less than the voltage level of the input signal IN_SIG.

The fixed time period circuit 136 is connected to the fast path comparator 134 to receive the compare signal COM_SIG and generate a switch signal SWITCH_SIG. The by-pass resistor 138 is connected to the source terminal of the switch transistor 102. The switch 140 is connected between the by-pass resistor 138 and ground. Further, the switch 140 is connected to the fixed time period circuit 136 to receive the switch signal SWITCH_SIG. When the fast path comparator 134 activates the compare signal COM_SIG, the fixed time period circuit 136 activates the switch signal SWITCH_SIG for a predetermined time period. In the present embodiment, the predetermined time period is 10 milliseconds.

The IC 100 further comprises a power circuit 142 that generates a power enable signal PWR_SIG. The power circuit 142 activates the power enable signal PWR_SIG when the power source is disconnected from the IC 100. The activated power enable signal PWR_SIG indicates that the power source is disconnected from the input port of the IC 100 (i.e., the source terminal of the switch transistor 102). The power circuit 142 includes first and second resistors 144 and 146, a power comparator 148, and a second reference supply 150.

The first and second resistors 144 and 146 are connected in series and the series combination of the first and second resistors 144 and 146 is connected between the source terminal of the switch transistor 102 and ground. The power comparator 148 is connected to the second reference supply 150 to receive a second reference signal REF2_SIG. The power comparator 148 has a first terminal to receive a second reference signal REF2_SIG, a second terminal connected to a node between the first and second resistors 144 and 146 to receive a third reference signal REF3_SIG, and an output terminal that generates a power enable signal PWR_SIG. The power comparator 148 compares a voltage level of the second reference signal REF2_SIG with a voltage level of the third reference signal REF3_SIG and generates the power enable signal PWR_SIG. The power comparator 148 activates the power enable signal PWR_SIG when a voltage level of the second reference signal REF2_SIG is greater than the voltage level of the third reference signal REF3_SIG and deactivates the power enable signal PWR_SIG when the voltage level of the second reference signal REF2_SIG is less than the voltage level of the third reference signal REF3_SIG. In one embodiment, the power enable signal PWR_SIG is provided to a controller (not shown) to indicate that the power source is disconnected from the IC 100. The IC 100 further includes a filter capacitor 152 connected to the source terminal of the switch transistor 102 to filter the input signal IN_SIG.

Figure 2B:
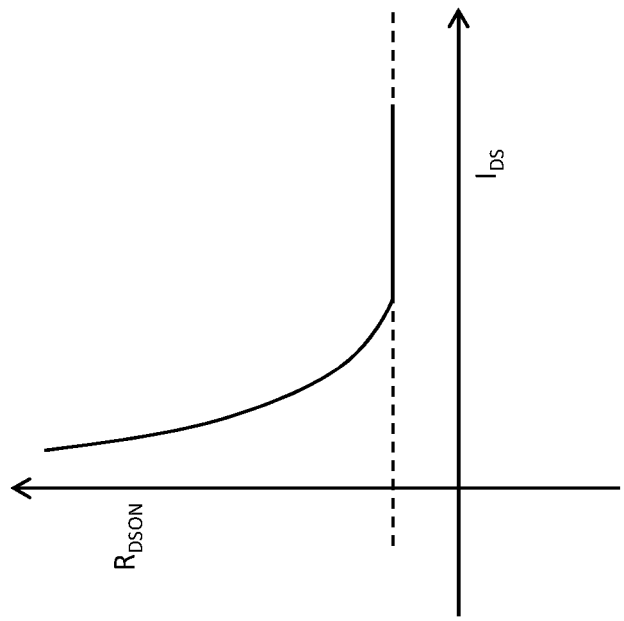
FIGS. 2A and 2B are transfer characteristics of a switch transistor implemented in the IC of FIG. 1 in accordance with an embodiment of the present invention.
Figure 2A:
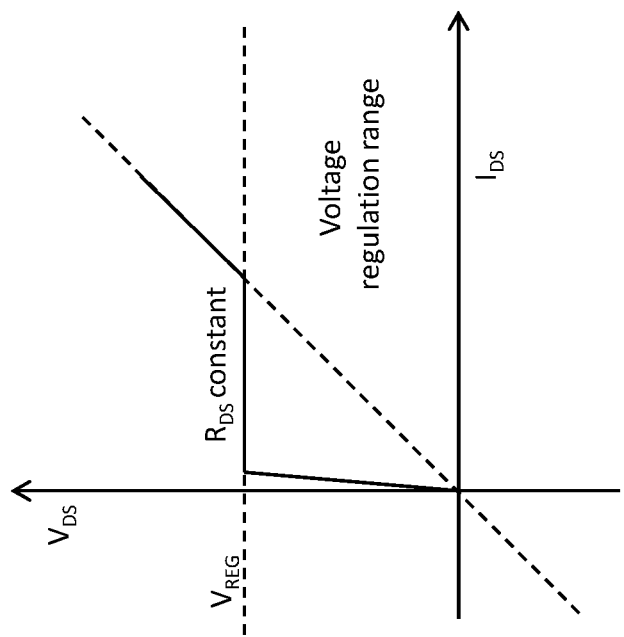

Referring now to FIGS. 2A and 2B, a transfer characteristic of the switch transistor 102 in accordance with an embodiment of the present invention is shown. FIG. 2A shows a graph of a voltage across the drain and source terminals of the switch transistor 102 versus a current flowing through the drain and source terminals of the switch transistor 102. Hereinafter, the voltage across the drain and source terminals of the switch transistor 102 is referred to as "a drain source voltage $V_{DS}$", the current flowing through the drain and source terminals of the switch transistor 102 is referred to as "a drain source current $I_{DS}$", and the resistance of the switch transistor 102 when the switch transistor 102 is switched ON is referred to as "drain source resistance $R_{DSON}$". The dotted line indicates the transfer characteristic of an ideal switch transistor 102. For an ideal switch transistor 102, the drain source voltage $V_{DS}$ is directly proportional to the drain source current $I_{DS}$. Thus, the drain source voltage $V_{DS}$ increases linearly with the drain source current $I_{DS}$. However, for the switch transistor 102 of the present invention, the drain source current $I_{DS}$ increases non-linearly till the drain source voltage $V_{DS}$ is equal to a voltage level $V_{REG}$ of the regulated signal REG_SIG. When the drain source voltage $V_{DS}$ is equal to the voltage level $V_{REG}$ of the regulated signal REG_SIG, the drain source voltage $V_{DS}$ remains constant irrespective of an increase in the drain source current $I_{DS}$. When the drain source resistance $R_{DS}$ is constant, the drain source current $I_{DS}$ increases linearly with the increase in the drain source voltage $V_{DS}$. FIG. 2B shows a graph of the drain source resistance $R_{DSON}$ versus the drain source current $I_{DS}$. For the ideal switch transistor 102, the drain source resistance $R_{DSON}$ remains constant with an increase in the drain source current $I_{DS}$. However, for the switch transistor 102 of the present invention, the drain source resistance $R_{DSON}$ of the switch transistor 102 decreases exponentially with the increase in the drain source current $I_{DS}$.

Figure 3:
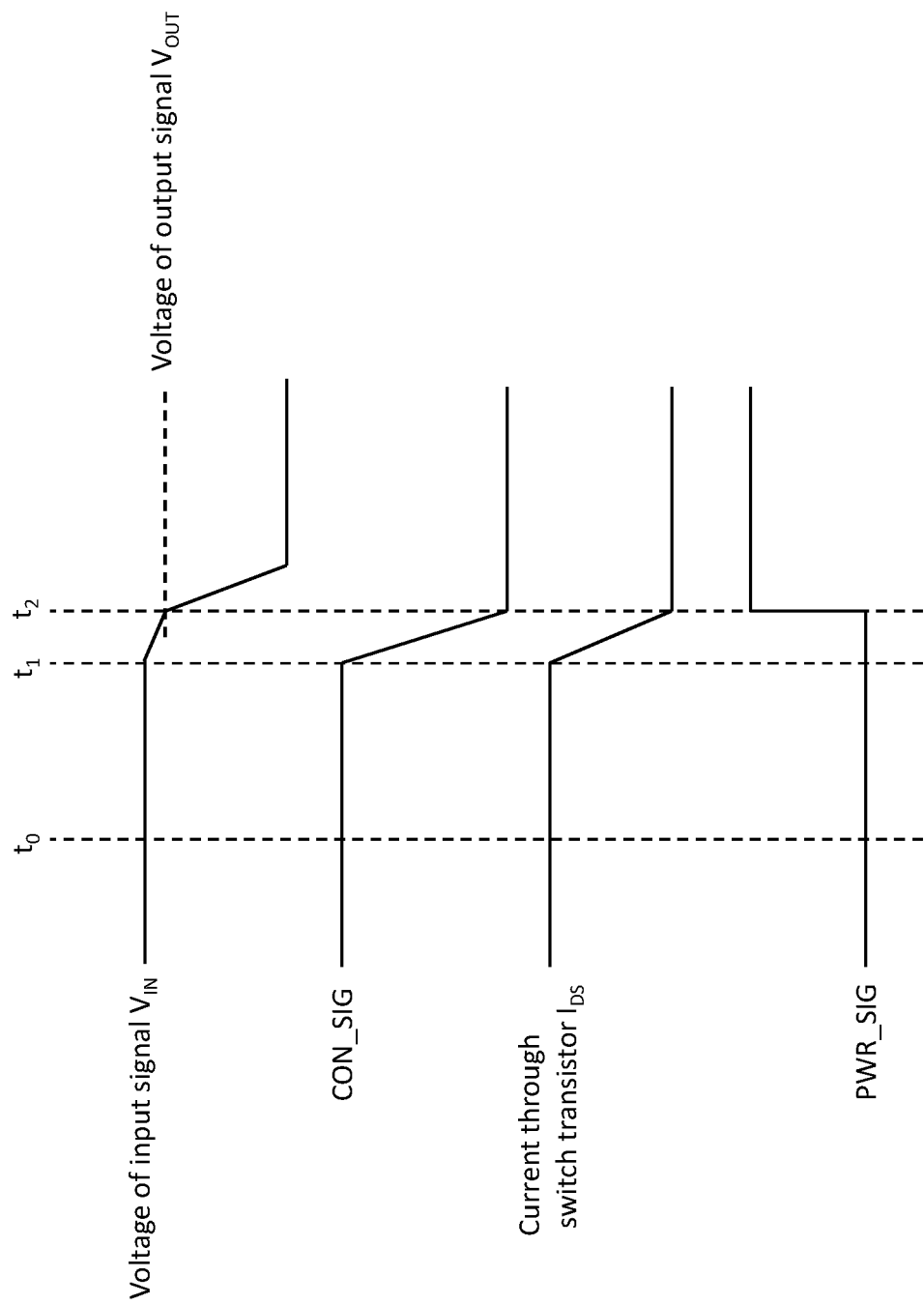
FIG. 3 is a timing diagram illustrating various signals of the IC of FIG. 1 in accordance with an embodiment of the present invention.

Referring now to FIG. 3, a timing diagram illustrating the voltage level of the input signal IN_SIG, the voltage level of the control signal CON_SIG, the drain source current $I_{DS}$, and the power enable signal PWR_SIG is shown.

At time $t_0$, when the power source is connected, the power source provides the input signal IN_SIG to the input port of the IC 100. The gate driver circuit 104 receives the input signal IN_SIG and activates the control signal CON_SIG. The switch and sense transistors 102 and 116 are switched ON. The sense transistor 116 receives the input signal IN_SIG and generates the intermediate signal INT_SIG. The current level of the intermediate signal INT_SIG is approximately equal to the current level of the input signal IN_SIG. The amplifier 118 compares the voltage levels of the intermediate and output signals INT_SIG and OUT_SIG and deactivates the intermediate output signal INT_OUT. The intermediate transistor 120 generates the intermediate sense signal ISENSE which has a current level equal to the current level of the input signal IN_SIG. The sense resistor 122 generates the sense signal SENSE_SIG which has a voltage level that corresponds to the input signal IN_SIG. The first comparator 126 compares the sense signal SENSE_SIG with the first reference signal REF1_SIG and generates the enable signal EN_SIG. Since the switch transistor 102 is activated, the voltage level of the sense signal SENSE_SIG is greater than the first reference signal REF1_SIG. The first comparator 126 deactivates the enable signal EN_SIG, thereby deactivating the transconductance amplifier 128.

At time $t_1$, when the power source is disconnected, the input signal IN_SIG decreases. The fast path comparator 134 activates the compare signal COM_SIG and connects the source terminal of the switch transistor 102 to ground for the predetermined time period. Since, the power source is disconnected, the drain source current $I_{DS}$ decreases, and hence, the current levels of the intermediate signal INT_SIG and the intermediate sense signal ISENSE decrease. This leads to a decrease in the voltage level of the sense signal SENSE_SIG below the voltage level of the first reference signal REF1_SIG. Thus, the first comparator 126 activates the enable signal EN_SIG. The voltage drop amplifier 124 compares the voltages at the input and output ports of the IC 100 and generates the difference signal DIFF_SIG. The transconductance amplifier 128 compares the difference signal DIFF_SIG with the regulated signal REG_SIG and sinks the current of the control signal CON_SIG. Since, the current of the control signal CON_SIG decreases, the resistance of the switch transistor 102 increases. An increase in the resistance of the switch transistor 102 results in an increase in the voltage across the switch transistor 102. The control signal CON_SIG continues to decrease till the voltage level of the difference signal DIFF_SIG is equal to the voltage level of the regulated signal REG_SIG.

At time $t_2$, the voltage level of the input signal IN_SIG is equal to the voltage level of the output signal OUT_SIG. The control signal CON_SIG is reduced to zero, thereby switching OFF the switch transistor 102. The drain source current $I_{DS}$ is reduced to zero. Thus, the first and second resistors 144 and 146 deactivates the third reference signal REF3_SIG. The power comparator 148 compares the third reference signal REF3_SIG with the second reference signal REF2_SIG and activates the power enable signal PWR_SIG. The operation of the IC 100 when the drain source current $I_{DS}$ is less than a threshold current when the power source is connected thereto is similar to the operation of the IC 100 when the drain source current $I_{DS}$ is less than a threshold current without switching OFF the switch transistor 102 i.e. when the power source is not connected thereto. The threshold current is defined as a current level of the input signal IN_SIG below which a conventional current sensor circuit inaccurately detects the current level of the input signal IN_SIG.

When the drain source current $I_{DS}$ is less than the threshold current, the transconductance amplifier 128 increases the voltage across the switch transistor 102. Thus, when the drain source current $I_{DS}$ is less than the threshold current, the current sensor circuit 106 detects the drain source current $I_{DS}$ with improved current sense accuracy. Further, when the power source is disconnected, the voltage drop regulation circuit 108 switches OFF the switch transistor 102, thereby preventing a reverse current flow from the battery to the input port.

Figure 4:
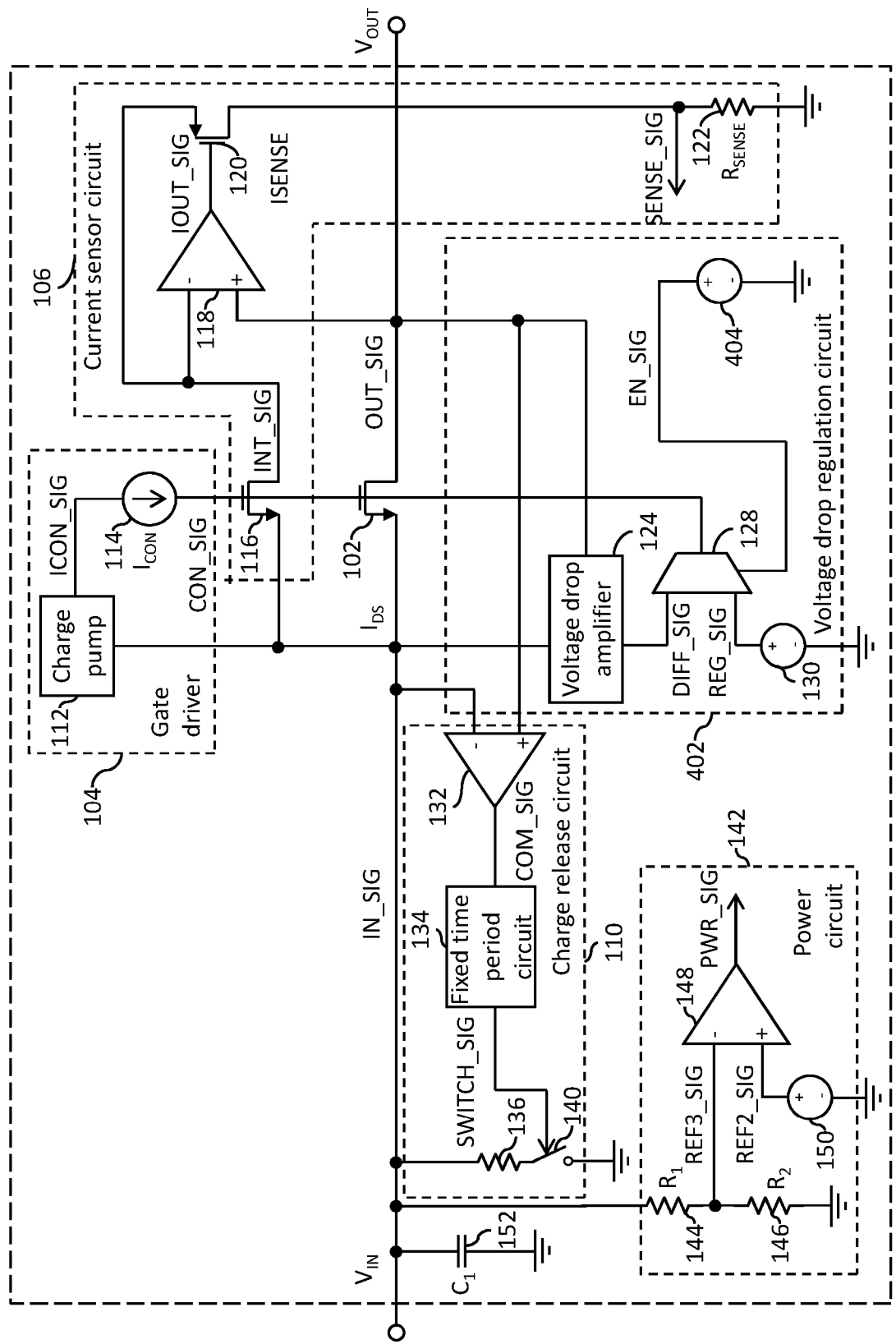
FIG. 4 is a schematic block diagram of an IC in accordance with another embodiment of the present invention.

Referring now to FIG. 4, a schematic block diagram of an integrated circuit (IC) 400 in accordance with another embodiment of the present invention is shown. The IC 400 includes the switch transistor 102, the gate driver circuit 104, the current sensor circuit 106, a voltage drop regulation circuit 402, the charge-release circuit 110, and the power circuit 142. The switch transistor 102, the gate driver circuit 104, the current sensor circuit 106, the charge-release circuit 110, the power circuit 142 of the FIG. 4 are structurally and functionally similar to the switch transistor 102, the gate driver circuit 104, the current sensor circuit 106, the charge-release circuit 110, and the power circuit 142 of FIG. 1. Therefore, description of the switch transistor 102, the gate driver circuit 104, the current sensor circuit 106, the charge-release circuit 110, and the power circuit 142 of FIG. 4 is avoided for the sake of brevity.

The voltage drop regulation circuit 402 includes the voltage drop amplifier 124, the transconductance amplifier 128, the first reference supply 130, and a constant voltage source 404. The voltage drop amplifier 124, the transconductance amplifier 128, the first reference supply 130 of the FIG. 4 is structurally and functionally similar to the voltage drop amplifier 124, the transconductance amplifier 128, the first reference supply 130 of the FIG. 1.

An enable terminal of the transconductance amplifier 128 is connected to the constant voltage source 404. Thus, the transconductance amplifier 128 of the FIG. 4 is enabled irrespective of a sense signal SENSE_SIG generated by the current sensor circuit 106. The transconductance amplifier 128 sets the voltage across the switch transistor 102 which is equal to a voltage level of the regulated signal REG_SIG. The sense signal SENSE_SIG is received by a controller (not shown) to detect a current level of the input signal IN_SIG.

In the claims, the words 'comprising', 'including' and 'having' do not exclude the presence of other elements or steps then those listed in a claim. The terms "a" or "an," as used herein, are defined as one or more than one. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit (IC), comprising:
   a switch transistor that has a source terminal for receiving an input signal and a drain terminal that provides an output signal;
   a gate driver circuit, connected to the gate and source terminals of the switch transistor, wherein the gate driver circuit receives the input signal and generates a control signal, and drives the gate terminal of the switch transistor using the control signal;
   a current sensor circuit, connected to the source and drain terminals of the switch transistor and to the gate driver circuit, wherein the current sensor circuit receives the input and output signals and the control signal, and generates a sense signal that is indicative of a current level of the input signal;
   a voltage drop regulation circuit, connected to the source and drain terminals of the switch transistor, the gate driver circuit, and the current sensor circuit, wherein the voltage drip regulation circuit receives a regulated signal, a first reference signal, and the input, output, and sense signals, and sinks a current of the control signal when a voltage level of the sense signal is less than a voltage level of the first reference signal, thereby increasing a voltage across the switch transistor; and
   a charge-release circuit, connected to the source and drain terminals of the switch transistor to receive the input and output signals, respectively, wherein the charge-release circuit connects the source terminal of the switch transistor to ground for a predetermined time period when a voltage level of the input signal is less than a voltage level of the output signal.

2. The IC of claim 1, wherein the gate driver circuit comprises:
   a charge pump connected to the source terminal of the switch transistor, wherein the charge pump receives the input signal and generates an intermediate control signal; and
   a current source connected to the charge pump, wherein the current source receives the intermediate control signal and generates the control signal.

3. The IC of claim 1, wherein the current sensor circuit comprises:
   a sense transistor that has a source terminal connected to the source terminal of the switch transistor to receive the input signal, a gate terminal connected to the gate terminal of the switch transistor to receive the control signal, and a drain terminal that provides an intermediate signal, wherein the gate driver circuit drives the gate terminals of the switch and sense transistors using the control signal;
   an amplifier that has a first terminal connected to the drain terminal of the sense transistor to receive the intermediate signal, a second terminal connected to the drain terminal of the switch transistor to receive the output signal, and an output terminal that outputs an intermediate output signal based on a comparison of a voltage level of the intermediate signal with the voltage level of the output signal;
an intermediate transistor that has a source terminal connected to the drain terminal of the sense transistor to receive the intermediate signal, a gate terminal connected to the output terminal of the amplifier to receive the intermediate output signal, and a drain terminal to output an intermediate sense signal; and
a sense resistor connected between the drain terminal of the intermediate transistor and ground, wherein the sense resistor receives the intermediate sense signal and generates the sense signal.

4. The IC of claim 3, wherein the switch and sense transistors are N-channel metal-oxide semiconductor (NMOS) transistors, and the intermediate transistor is a P-channel metal-oxide semiconductor (PMOS) transistor.

5. The IC of claim 3, wherein the voltage drop regulation circuit comprises:
a first comparator that has a first terminal connected to the sense resistor to receive the sense signal, a second terminal to receive the first reference signal, and an output terminal that generates an enable signal based on a comparison of the first reference signal with the sense signal, wherein the first comparator activates the enable signal when the voltage level of the first reference signal is greater than the voltage level of the sense signal and deactivates the enable signal when the voltage level of the first reference signal is less than the voltage level of the sense signal;
a voltage drop amplifier that has a first terminal connected to the source terminal of the switch transistor to receive the input signal, a second terminal connected to the drain terminal of the switch transistor to receive the output signal, and an output terminal that generates a difference signal based on a comparison of the voltage levels of the input and output signals, wherein the difference signal is indicative of the voltage across the switch transistor; and
a transconductance amplifier having a first terminal connected to the voltage drop amplifier to receive the difference signal, a second terminal that receives the regulated signal, an enable terminal connected to the first comparator to receive the enable signal, and an output terminal that sinks the current of the control signal when the enable signal is active.

6. The IC of claim 1, wherein the charge-release circuit comprises:
a fast path comparator that has first and second terminals connected to the source and drain terminals of the switch transistor to receive the input and output signals, respectively, and an output terminal that generates a compare signal, wherein the fast path comparator activates the compare signal when the voltage level of the output signal is greater than the voltage level of the input signal and deactivates the compare signal when the voltage level of the output signal is less than the voltage level of the input signal;
a fixed time period circuit connected to the fast path comparator to receive the compare signal and generate a switch signal;
a by-pass resistor connected to the source terminal of the switch transistor; and
a switch connected between the by-pass resistor and ground, and to the fixed time period circuit to receive the switch signal, wherein the fixed time period circuit activates the switch signal for the predetermined time period, thereby activating the switch for the predetermined time period.

7. The IC of claim 1, further comprising a power circuit, wherein the power circuit comprises:
first and second resistors connected between the source terminal of the switch transistor and ground, wherein the first resistor is connected in series with the second resistor; and
a power comparator that has a first terminal that receives a second reference signal, a second terminal connected to a node between the first and second resistors to receive a third reference signal, and an output terminal that generates a power enable signal based on a comparison of a voltage level of the second reference signal with a voltage level of the third reference signal,
wherein the power comparator activates the power enable signal when the voltage level of the second reference signal is greater than the voltage level of the third reference signal and deactivates the power enable signal when the voltage level of the second reference signal is less than the voltage level of the third reference signal, and
wherein the power enable signal is indicative of disconnection of a power source from the source terminal of the switch transistor.

8. The IC of claim 1, wherein the predetermined time period is 10 milliseconds.

9. An integrated circuit (IC), comprising:
a switch transistor that has a source terminal for receiving an input signal and a drain terminal that provides an output signal;
a gate driver circuit connected to the source and gate terminals of the switch transistor, wherein the gate driver circuit receives the input signal and generates a control signal;
a current sensor circuit, comprising:
a sense transistor that has a source terminal connected to the source terminal of the switch transistor to receive the input signal, a gate terminal connected to the gate terminal of the switch transistor to receive the control signal, and a drain terminal that outputs an intermediate signal, wherein the gate driver circuit drives the gate terminals of the switch and sense transistors using the control signal;
an amplifier having a first terminal connected to the drain terminal of the sense transistor to receive the intermediate signal, a second terminal connected to the drain terminal of the switch transistor to receive the output signal, and an output terminal to output an intermediate output signal based on a comparison of a voltage level of the intermediate signal with a voltage level of the output signal;
an intermediate transistor that has a source terminal connected to the drain terminal of the sense transistor to receive the intermediate signal, a gate terminal connected to the output terminal of the amplifier to receive the intermediate output signal, and a drain terminal to output an intermediate sense signal; and
a sense resistor, connected between the drain terminal of the intermediate transistor and ground, that receives the intermediate sense signal and generates a sense signal, wherein the sense signal is indicative of a current level of the input signal;
a voltage drop regulation circuit, comprising:
a first comparator that has a first terminal connected to the sense resistor to receive the sense signal, a second terminal to receive a first reference signal, and an output terminal that generates an enable signal based on a comparison of a voltage level of the first reference signal with a voltage level of the sense signal, wherein the first comparator activates the enable signal when the voltage level of the first reference signal is greater than the voltage level of the sense signal and deactivates the enable signal when the voltage level of the first reference signal is less than the voltage level of the sense signal;

a voltage drop amplifier that has a first terminal connected to the source terminal of the switch transistor to receive the input signal, a second terminal connected to the drain terminal of the switch transistor to receive the output signal, and an output terminal that generates a difference signal based on a comparison of a voltage level of the input signal and the voltage level of the output signals, and wherein the difference signal is indicative of a voltage across the switch transistor; and a transconductance amplifier having a first terminal connected to the voltage drop amplifier to receive the difference signal, a second terminal that receives a regulated signal, an enable terminal connected to the first comparator to receive the enable signal, and an output terminal that sinks a current of the control signal when the first comparator activates the enable signal, whereby the voltage drop regulation circuit increases the voltage across the switch transistor; and a charge-release circuit, comprising:

a fast path comparator that has first and second terminals connected to the source and drain terminals of the switch transistor to receive the input and output signals, respectively, and an output terminal that generates a compare signal, wherein the fast path comparator activates the compare signal when the voltage level of the output signal is greater than the voltage level of the input signal and deactivates the compare signal when the voltage level of the output signal is less than the voltage level of the input signal;

a fixed time period circuit that is connected to the fast path comparator to receive the compare signal and generate a switch signal;

a by-pass resistor that is connected to the source terminal of the switch transistor; and a switch, connected between the by-pass resistor and ground, that is connected to the fast path comparator to receive the switch signal, wherein the fixed time period circuit activates the switch signal for a predetermined time period, thereby activating the switch for the predetermined time period.

10. The IC of claim 9, further comprising a power circuit, wherein the power circuit comprises:

first and second resistors connected between the source terminal of the switch transistor and ground, wherein the first resistor is connected in series with the second resistor; and a power comparator that has a first terminal that receives a second reference signal, a second terminal connected to a node between the first and second resistors to receive a third reference signal, and an output terminal that generates a power enable signal, wherein the power comparator activates the power enable signal when the voltage level of the second reference signal is greater than the voltage level of the third reference signal and deactivates the power enable signal when the voltage level of the second reference signal is less than the voltage level of the third reference signal, and wherein the power enable signal is indicative of disconnection of a power source from the source terminal of the switch transistor.

11. The IC of claim 9, wherein the gate driver circuit comprises:

a charge pump connected to the source terminal of the switch transistor, wherein the charge pump receives the input signal and generates an intermediate control signal; and a current source connected to the charge pump, wherein the current source receives the intermediate control signal and generates the control signal.

12. The IC of claim 9, wherein the switch and sense transistors are n-channel metal-oxide semiconductor (NMOS) transistors, and the intermediate transistor is a p-channel metal-oxide semiconductor (LIMOS) transistor.

13. The IC of claim 9, wherein the predetermined time period is 10 milliseconds.

14. An integrated circuit (IC), comprising:

a switch transistor that has a source terminal to receive an input signal and a drain terminal to output an output signal;

a gate driver circuit, connected to the source terminal of the switch transistor and a gate terminal of the switch transistor, that receives the input signal and generates a control signal, wherein the gate driver circuit drives the gate terminal of the switch transistor using the control signal;

a voltage drop regulation circuit, connected to the source and drain terminals of the switch transistor, and the gate driver circuit, that receives a regulated signal, an enable signal, and the input and output signals, and sinks a current of the control signal, whereby the voltage drop regulation circuit increases a voltage across the switch transistor; and a charge-release circuit, connected to the source and drain terminals of the switch transistor to receive the input and output signals, respectively, wherein the charge-release circuit connects the source terminal of the switch transistor to ground for a predetermined time period when a voltage level of the input signal is less than a voltage level of the output signal.

15. The IC of claim 14, wherein the gate driver circuit comprises:

a charge pump, connected to the source terminal of the switch transistor, that receives the input signal and generates an intermediate control signal; and a current source, connected to the charge pump, that receives the intermediate control signal and generates the control signal.

16. The IC of claim 14, further comprising a current sensor circuit, wherein the current sensor circuit comprises:

a sense transistor that has a source terminal connected to the source terminal of the switch transistor to receive the input signal, a gate terminal connected to the gate terminal of the switch transistor to receive the control signal, and a drain terminal that outputs an intermediate signal, wherein the gate driver circuit drives the gate terminals of the switch and sense transistors using the control signal;

an amplifier having a first terminal connected to the drain terminal of the sense transistor to receive the intermediate signal, a second terminal connected to the drain terminal of the switch transistor to receive the output signal, and an output terminal to output an intermediate output signal based on a comparison of a voltage level of the intermediate signal with the voltage level of the output signal;

an intermediate transistor that has a source terminal connected to the drain terminal of the sense transistor to receive the intermediate signal, a gate terminal connected to the output terminal of the amplifier to receive the intermediate output signal, and a drain terminal to output an intermediate sense signal; and a sense resistor, connected between the drain terminal of the intermediate transistor and ground, that receives the intermediate sense signal and generates a sense signal, wherein the sense signal is indicative of a current level of the input signal.

17. The IC of claim 16, wherein the switch and sense transistors are n-channel metal-oxide semiconductor (NMOS) transistors, and the intermediate transistor is a p-channel metal-oxide semiconductor (PMOS) transistor.

18. The IC of claim 14, wherein the voltage drop regulation circuit comprises:

a voltage drop amplifier that has a first terminal connected to the source terminal of the switch transistor to receive the input signal, a second terminal connected to the drain terminal of the switch transistor to receive the output signal, and an output terminal that generates a difference signal based on a comparison of the voltage levels of the input and output signals, wherein the difference signal is indicative of the voltage across the switch transistor;

a constant voltage source that generates the enable signal; and a transconductance amplifier having a first terminal connected to the voltage drop amplifier to receive the difference signal, a second terminal that receives the regulated signal, an enable terminal connected to the constant voltage source to receive the enable signal, and an output terminal that sinks a current of the control signal.

19. The IC of claim 14, wherein the charge-release circuit comprises:

a fast path comparator that has first and second terminals connected to connected to the source and drain terminals of the switch transistor to receive the input and output signals, respectively, and an output terminal that generates a compare signal, wherein the fast path comparator activates the compare signal when the voltage level of the output signal is greater than the voltage level of the input signal and deactivates the compare signal when the voltage level of the output signal is less than the voltage level of the input signal;

a fixed time period circuit, connected to the fast path comparator to receive the compare signal and generate a switch signal;

a by-pass resistor that is connected to the source terminal of the switch transistor; and a switch, connected between the by-pass resistor and ground, that is connected to the fast path comparator to receive the switch signal, wherein the fixed time period circuit activates the switch signal for the predetermined time period, thereby activating the switch for the predetermined time period.

20. The IC of claim 14, further comprising a power circuit, wherein the power circuit comprises:

first and second resistors, connected between the source terminal of the switch transistor and ground, wherein the first resistor is connected in series with the second resistor; and a power comparator that has a first terminal to receive a second reference signal, a second terminal connected to a node between the first and second resistors to receive a third reference signal, and an output terminal that generates a power enable signal, wherein the power comparator activates the power enable signal when the voltage level of the first reference signal is greater than the voltage level of the second reference signal and deactivates the power enable signal when the voltage level of the first reference signal is less than the voltage level of the second reference signal, and wherein the power enable signal is indicative of disconnection of a power source from the source terminal of the switch transistor.

* * * * *